(12) United States Patent
Hanham et al.

(10) Patent No.: US 10,747,613 B2
(45) Date of Patent: Aug. 18, 2020

(54) POOLED FRONTLINE ECC DECODERS IN MEMORY SYSTEMS

(71) Applicant: Toshiba Memory Corporation, Tokyo (JP)

(72) Inventors: Paul Edward Hanham, Froxfield (GB); David Malcolm Symons, Kidlington (GB); Francesco Giorgio, Headington (GB); Senthilkumar Diraviam, Sunnyvale, CA (US); Jonghyeon Kim, San Jose, CA (US)

(73) Assignee: Toshiba Memory Corporation, Tokyo (JP)

( * ) Notice: Subject to any disclaimer, the term of this patent is extended or adjusted under 35 U.S.C. 154(b) by 33 days.

(21) Appl. No.: 16/125,283

(22) Filed: Sep. 7, 2018

(65) Prior Publication Data

US 2020/0081773 A1   Mar. 12, 2020

(51) Int. Cl.
*G06F 11/10* (2006.01)
*G11C 29/52* (2006.01)
*H03M 13/29* (2006.01)

(52) U.S. Cl.
CPC ...... *G06F 11/1068* (2013.01); *G06F 11/1048* (2013.01); *G11C 29/52* (2013.01); *H03M 13/2906* (2013.01)

(58) Field of Classification Search
CPC ..... G11C 29/42; G11C 29/52; G06F 11/1068; G06F 11/1072; G06F 3/0619; G06F 11/1048; H03M 13/2906
See application file for complete search history.

(56) References Cited

U.S. PATENT DOCUMENTS

| 2011/0307758 | A1 | 12/2011 | Fillingim | |
|---|---|---|---|---|
| 2012/0166906 | A1 | 6/2012 | Nagadomi et al. | |
| 2012/0198129 | A1 | 8/2012 | Van Aken et al. | |
| 2017/0168895 | A1* | 6/2017 | Fu | G06F 11/1072 |
| 2017/0187397 | A1* | 6/2017 | Kim | G06F 11/1068 |

FOREIGN PATENT DOCUMENTS

JP   2012-137994 A   7/2012

OTHER PUBLICATIONS

International Search Report and Written Opinion for corresponding International Patent Application No. PCT/IB2019/057495, dated Nov. 26, 2019, 10 pages.

* cited by examiner

*Primary Examiner* — Shelly A Chase
(74) *Attorney, Agent, or Firm* — Foley & Lardner LLP

(57) ABSTRACT

Various implementations described herein relate to systems and methods for correcting data from memory systems such as a plurality of non-volatile memory devices of a Solid State Drive (SSD), including but not limited to, receiving frames of the data from the plurality of non-volatile memory devices, allocating the frames among pooled frontline Error Correction Code (ECC) decoders, decoding, by the pooled frontline ECC decoders, the frames to output first decoded frames, and returning the first decoded frames to the read channels.

17 Claims, 4 Drawing Sheets

POOLED FRONTLINE ECC DECODERS IN MEMORY SYSTEMS

TECHNICAL FIELD

The present disclosure relates generally to systems and methods for improving data integrity of memory systems (e.g. Solid State Drives (SSDs)).

BACKGROUND

A traditional non-volatile memory controller includes Error Correction Code (ECC) decoders configured to correct data from non-volatile memory devices in a memory system such as an SSD. Types of non-volatile memory include NAND flash memory, NOR flash memory, magnetic RAM (MRAM), resistive RAM (RRAM), phase change memory (PCM) and battery-backed volatile memories. For example, a multi-channel controller with N memory channels (e.g. where N may be 4, 8, 16 etc.) typically has N channel ECC decoders, one per channel, to provide high-bandwidth, independent parallel operation. The multi-channel ECC decoders form a first layer or line of ECC decoders referred to as "frontline" decoders. The frontline decoders are the first error correcting decoders that the data from the non-volatile memory devices encounter. The "frontline" decoders are capable of correcting the data frames read from the non-volatile memory devices under most circumstances, providing frames with no errors. The traditional controller may have subsequent decoders (e.g., "second-line" decoders, "third-line" decoders, "fourth-line" decoders, and so on) used in the event that the frontline decoders fail to correct all errors. Given that the subsequent decoders are not in use all the time, the subsequent decoders are typically shared among read channels used to communicate data from the non-volatile memory devices to a host. The subsequent decoders are located outside and away from the read channels. On the other hand, a dedicated frontline decoder is allocated for each read channel and is embedded or otherwise located in a respective read channel.

This traditional arrangement means that highly capable ECC resources must still be dedicated and fixed to each read channel, even if their error correcting capability is not fully employed all the time under all circumstances. For example, in the early stages of the lifecycle of non-volatile memory devices in an SSD, there may be few read errors, whereas later in the lifecycle there may be orders of magnitude more errors. Another factor is that there may be wide variations in error rates, such as between the read errors from different pages of a memory block in a non-volatile memory, between memory blocks in a single device, or between memory devices. There may also be wide variations in error rates due to temperature variations, the length of time between the time the data is first read and the time it was originally written (the retention period of the data), the number of times a block containing the data has previously been erased (the number of Program/Erase or P/E cycles), or due to the read/write activity on memory cells adjacent to the memory cells where the data is located. These variations may be compiled into sets of error characteristics and profiles for individual devices or ranges of devices. Dedicated frontline decoders with capabilities sized to cope with these variations will necessarily not have their full capabilities employed all the time, which is inefficient. There is therefore a need for a more efficient arrangement of ECC decoders under all circumstances when reading different non-volatile memory devices in an SSD.

SUMMARY

In certain aspects, the present implementations of an SSD device are directed to systems and methods for correcting data from a plurality of non-volatile memory devices of an SSD device, including but not limited to, receiving, by an arbiter via a plurality of read channels, frames of the data from the plurality of non-volatile memory devices, wherein all of the frames received are coded, allocating, by the arbiter, the frames among a plurality of pooled frontline Error Correction Code (ECC) decoders, decoding, by the plurality of pooled frontline ECC decoders, the frames to output first decoded frames, and returning, by the plurality of pooled frontline ECC decoders, the first decoded frames to the read channels.

DETAILED DESCRIPTION

Figure 1A:
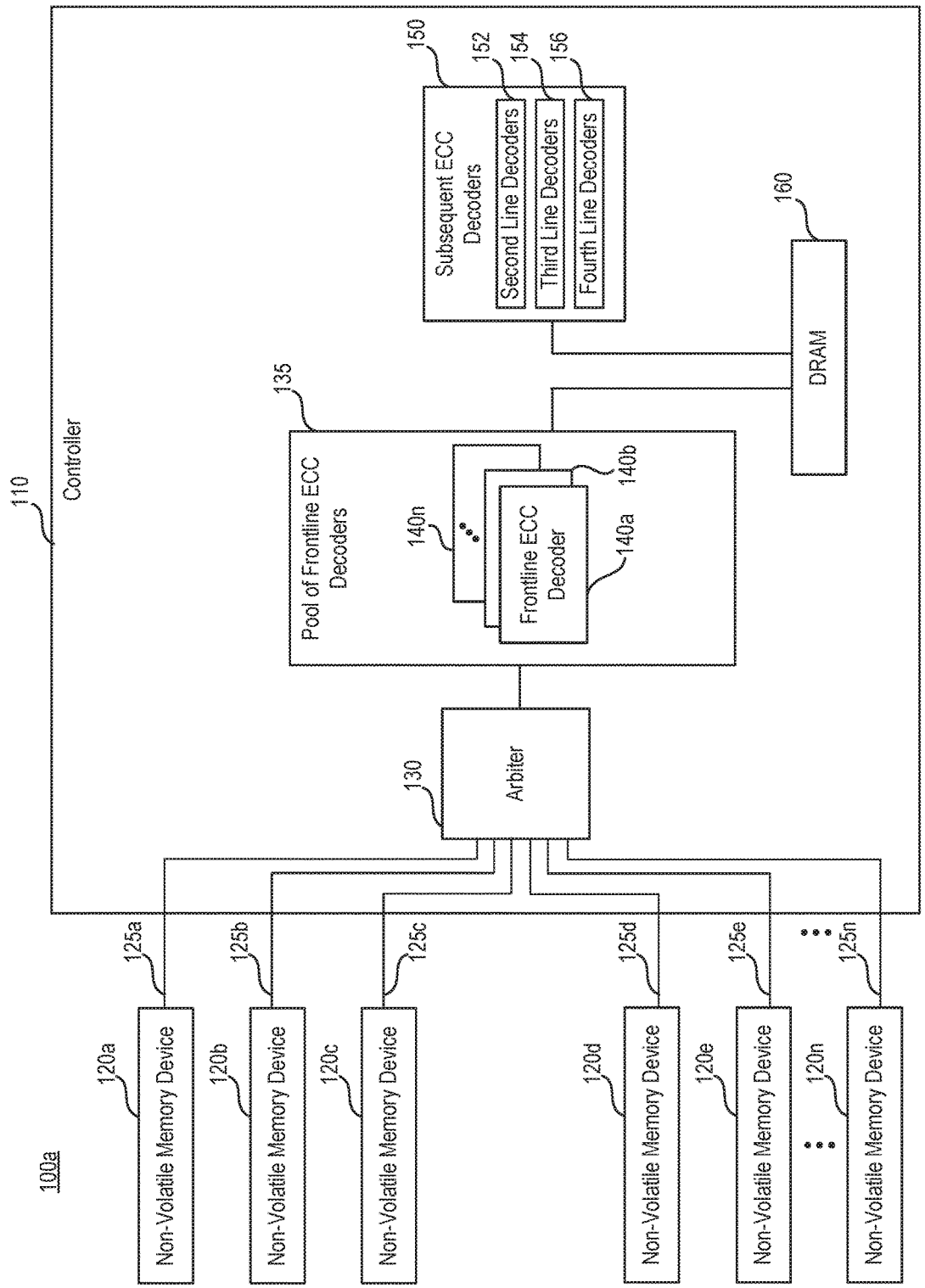
FIG. 1a shows a block diagram of a system for correcting data from non-volatile memory devices of an SSD device, according to some implementations.

As referred to herein, a "frontline" ECC decoder refers to an ECC decoder to which data from non-volatile memory devices first flows, before the data flows to another type of ECC decoder (such as "subsequent" ECC decoders). That is, a frontline ECC decoder is the first decoder to correct frames of the data from the non-volatile memory devices. In some examples, an uncorrected or coded frame of data is allocated to one of the frontline ECC decoders first, before being sent to a subsequent ECC decoder responsive to determining that the frontline ECC decoder has failed to correct all errors in the frame. The frontline ECC decoders are considered to be always used when attempting to read corrected data from the non-volatile memory devices in some cases. Traditionally, frontline ECC decoders are provided in respective read channels, such that a dedicated frontline ECC decoder decodes or corrects data for a given read channel. Arrangements described herein relate to a pool of frontline ECC decoders that are provided outside of or away from the read channels such that the frontline ECC decoders can be shared in the manner described.

A "subsequent" ECC decoder (e.g., a "second-line" ECC decoder, a "third-line" ECC decoder, a "fourth-line" ECC decoder, and so on) refers to an ECC decoder to which the data flows after a frontline ECC decoder fails to correct all errors in such data. The second-line ECC decoder, the third-line ECC decoder, and the fourth-line ECC decoder, in that order, are used to correct the data if the frontline decoders failed to fully correct the data. In terms of data flow, the frontline ECC decoders are between the non-volatile memory devices and the subsequent ECC decoders. The subsequent ECC decoders are provided outside of or away from the read channels. Typically, a frontline ECC decoder may have weaker error correcting capability (for example can correct a smaller number of errors, or correct only errors distributed randomly rather than in groups or bursts) or decode faster than a subsequent decoder and therefore may consume less power as compared to a subsequent decoder. A subsequent decoder may employ stronger ECC capability or decode more slowly and therefore consume more power and is typically better at decoding and correcting the data. In some arrangements, a subsequent decoder may be one of the frontline decoders, but is configured to run for a longer period of time for better decoding results.

Among other aspects, Applicant recognizes that a traditional controller of an SSD device includes channel ECC decoders (e.g., frontline ECC decoders) that are individually embedded in the read channels and are not shared. In some examples, to fully utilize the non-volatile memory devices, a read channel may need to support at least three different ECC strengths for reading memory pages selected by different word-lines (WL). By way of a non-limiting example, there may be one code for WL 0, another code for WL 1-49, and yet another code for WL 50-95. Applicant further observes that the decoders assigned to reading particular pages on particular word lines may vary as to the frequency of their use, such as the decoder for WL 0 not being used as frequently as the other decoders. In this particular instance therefore, it would be advantageous to share the decoders corresponding to WL 0 among read channels. In general, any decoder in a pool could be flexibly assigned on a frame-by-frame basis to decode any frame of data read from any read channel. A single frame could also be allocated to multiple decoders which could decode in unison in a coordinated fashion. Such implementations can conserve resources (e.g., reduce a number of decoders needed), thus reducing footprint and/or allow resources to be re-assigned to strengthen the other decoders.

Arrangements described herein relate to systems, apparatuses, methods, and non-transitory computer-readable media for correcting and decoding data from non-volatile memory devices by providing a pool of frontline ECC decoders and sharing the pool among all NAND read channels. The pooled frontline ECC decoders are not within the read channels. In some implementations, an arbiter can assign one of the pooled frontline ECC decoders to decode or otherwise correct the data.

In some implementations, multiple pools of frontline ECC decoders are provided. Each pool includes frontline ECC decoders having the same decode capabilities. Decode capabilities can vary from one pool to another. In that regard, each pool (including frontline ECC decoders having the same decode capabilities) can be shared by all read channels.

In other implementations, at least some frontline ECC decoders of a pool may have different decode capabilities than those of other frontline ECC decoders of the same pool. In that regard, the pool as a whole is multi-functional, supporting different decode capabilities and can be referred to as an "overlapped" pool. In a context of a plurality of such overlapped pools, each pool has all decode capabilities needed to correct and decode data from any read channel. Thus, each of multiple overlapped pools is responsible for correcting and decoding data for a different group of read channels (e.g., data from a group of read channels is sent to an assigned overlapped pool).

As such, the arrangements described herein can be configured to reduce stalling of the read channels as the frames of data are being decoded, if the pool of frontline ECC decoders has more shared resources (e.g., shared frontline ECC decoders) for decoding data, as compared to the traditional one-channel-one-decoder approach. In another configuration in which the pool of frontline ECC decoder has fewer shared resources than the traditional approach, a saving in resources may be traded in exchanged for delays introduced due to competition for access to the more limited resources. The pooled frontline ECC decoders can also run at a slower processing rate without stalling the read channels, assuming sufficient frontline ECC decoders are available. Furthermore, updating or reconfiguring a pooled frontline ECC decoder, which is described in more detail below, can be done without stalling an entire read channel, given that the data can be distributed among the remaining pooled frontline ECC decoders. Still further, an overall number of frontline ECC decoders can be reduced due to the sharing or pooling of the frontline ECC decoders. The implementations described herein can be implemented for non-volatile memory devices having widely spread sets of error characteristics or profiles. The implementations described herein are scalable.

To assist in illustrating certain aspects of the present implementations, FIG. 1a shows a block diagram of a system 100a for correcting data from non-volatile memory devices 120a-120n, according to some implementations. The system 100a corresponds to a portion of an SSD device. In some arrangements, the SSD device can be a part of a datacenter (not shown for brevity).

The system 100a includes the non-volatile memory devices 120a-120n and a controller 110. Examples of the non-volatile memory devices 120a-120n include but are not limited to, NAND flash memory devices, NOR flash memory devices, magnetic RAM (MRAM), resistive RAM (RRAM), phase change memory (PCM) and battery-backed volatile memories. The non-volatile memory devices 120a-120n form a non-volatile storage of the SSD device. The non-volatile memory devices 120a-120n are flash memory and include one or more individual non-volatile dies. Thus, the non-volatile memory devices 120a-120n refer to a plurality of non-volatile memory devices or dies within the SSD device. The non-volatile memory device 120a-120n can communicate the data stored therein via read channels 125a-125n. The read channels 125a-125n are data buses configured to communicate the data stored in the non-volatile memory device 120a-120n to the controller 110 to be processed, responsive to a read command (e.g., from a host).

The controller 110 can combine raw data storage in the non-volatile memory devices 120a-120n such that those non-volatile memory devices 120a-120n function like a single storage. The controller 110 can include microcontrollers, buffers, error correction functionality, FTL and flash interface modules, software, and firmware for implementing such functions.

The controller 110 includes suitable processing and memory capabilities for executing functions described herein. As described, the controller 110 manages various features for the non-volatile memory devices 120a-120n including, but not limited to, I/O handling, reading, writing, erasing, monitoring, logging, error handling, garbage collection, wear leveling, logical to physical address mapping, and the like. Thus, the controller 110 provides visibility to the non-volatile memory devices 120a-120n and FTLs associated thereof.

As described, the controller 110 provides error handling capabilities. The data stored in the non-volatile memory devices 120a-120n are encoded to reduce errors when the data is decoded for reading. In particular, ECC decoders 140a-140n and 150 are provided in the controller 110 to decode and correct the data responsive to a read command. For instance, the controller 110 includes a pool of frontline ECC decoders 135 defined by pooled frontline ECC decoders 140a-140n. One of ordinary skill in the art can appreciate that any number of frontline ECC decoders can be pooled together. The pooled frontline ECC decoders 140a-140n are aggregated in a way such that none of the pooled frontline ECC decoders 140a-140n are provided in or dedicated to any of read channels 125a-125n. The pooled frontline ECC decoders 140a-140n are shared among the read channels 125a-125n. In general, any one of the decoders 140a-140n in a pool could be flexibly assigned on a frame-by-frame basis to decode any frame of data read from any read channel 125a-125n. A single frame could also be allocated to two or more of decoders 140a-140n which could decode the frame in unison in a co-ordinated fashion.

The controller 110 includes an arbiter 130 configured to receive data from the non-volatile memory devices 120a-120n and to allocate or otherwise designate one of the pooled frontline ECC decoders 140a-140n to decode the data. The arbiter 130 includes suitable processing and memory capabilities for executing functions described herein. For example, the arbiter 130 may be a processing circuit having a processor and a memory. In some implementations, the arbiter 130 can be implemented with the processing capabilities of the controller 110. In other implementations, the arbiter 130 can be implemented with dedicated processing capabilities. The arbiter 130 is operatively coupled to the read channels 125a-125n to receive the data (e.g., frames of data) from the non-volatile memory devices 120a-120n.

The controller 110 has access to or is operatively coupled to a Dynamic Random Access Memory (DRAM) 140 operatively coupled to the pool of frontline ECC decoders 135 (e.g., to the pooled frontline ECC decoders 140a-140n) and subsequent ECC decoders 150. The DRAM 160 is configured to act as a buffer for frames of data that the pooled frontline ECC decoders 140a-140n have failed to decode and correct for access by subsequent ECC decoders 150.

The subsequent ECC decoders 150 include a second-line ECC decoder 152, a third-line ECC decoder 154, and a fourth-line ECC decoder 156. The subsequent ECC decoders 150 can be updated or configured with firmware. Responsive to determining that the frontline ECC decoders 140a-140n have failed to decode and correct a frame, the frame is sent to the second-line ECC decoder 152 to be decoded or corrected. Responsive to determining that the second-line ECC decoder 152 has failed to decode and correct the frame, the frame is sent to the third-line ECC decoder 154 to be decoded or corrected. Responsive to determining that the third-line ECC decoder 154 has failed to decode and correct the frame, the frame is sent to the fourth-line ECC decoder 156 to be decoded or corrected. One of ordinary skill in the art appreciates that any number of layers or lines of subsequent ECC decoders can be implemented. The decoded and corrected frame is buffered in DRAM 160 for access by subsequent functions to process the decoded and corrected frames (not shown for clarity). In one example, FJX frames that have failed to be decoded by the frontline ECC decoders 140a-140n are put in the DRAM 160. In that regard, the subsequent ECC decoders 150 (e.g., the second-line ECC decoder 152 and/or the third-line ECC decoder 154) can overwrite such failed frames with decoded frames.

Figure 1B:
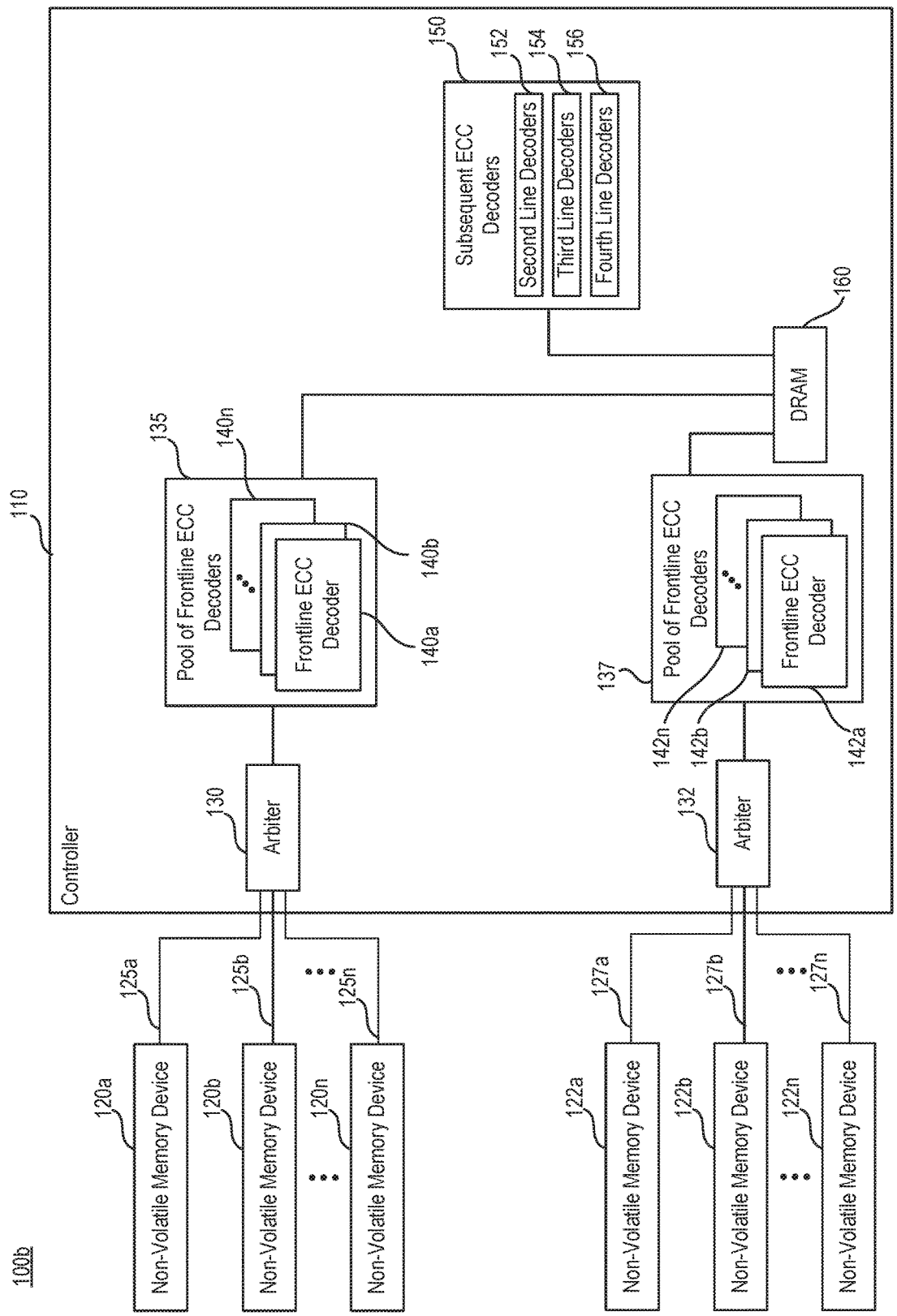
FIG. 1b shows another block diagram of a system for correcting data from non-volatile memory devices of an SSD device, according to some implementations.

In some arrangements, as shown in FIG. 1b, the controller 110 in the system 100b may provide one or more additional pools of frontline ECC decoders (e.g., a pool of frontline ECC decoders 137) for other non-volatile memory devices in the SSD device. As shown, non-volatile memory devices 122a-122n can send frames of data via read channels 127a-127n to an arbiter 132. The arbiter 132 selects one of frontline ECC decoders 142a-142n to decode and correct the frames in a manner described with respect to the arbiter 130. The frames that cannot be corrected by the frontline ECC decoders 142a-142n in the manner described can be passed to (e.g., stored and buffered in) the DRAM 160 for access by the subsequent ECC decoders 150, which can decode and correct the frames. In some arrangements, an application specific integrated circuit (ASIC) implementing the controller 110 may benefit from having multiple arbiters and pools of frontline ECC decoders in order to ease circuit layout, with arbiters and pools of frontline ECC decoders being co-located with the locations of groups of flash memory device channels. This can also improve floorplan layout and footprint, power consumption, and space-efficiency of the ASIC. Each arbiter can serve a number of nearby read channels. For example, the arbiter 130 serves the read channels 125a-125n, which are closer to the arbiter 130 and the pool of frontline ECC decoders 135 than other arbiters (e.g., the arbiter 132) and other pools (e.g., the pool of frontline ECC decoders 137). The arbiter 132 serves the read channels 127a-127n, which are closer to the arbiter 132 and the pool of frontline ECC decoders 137 than other arbiters (e.g., the arbiter 130) and other pools (e.g., the pool of frontline ECC decoders 135).

Figure 2:
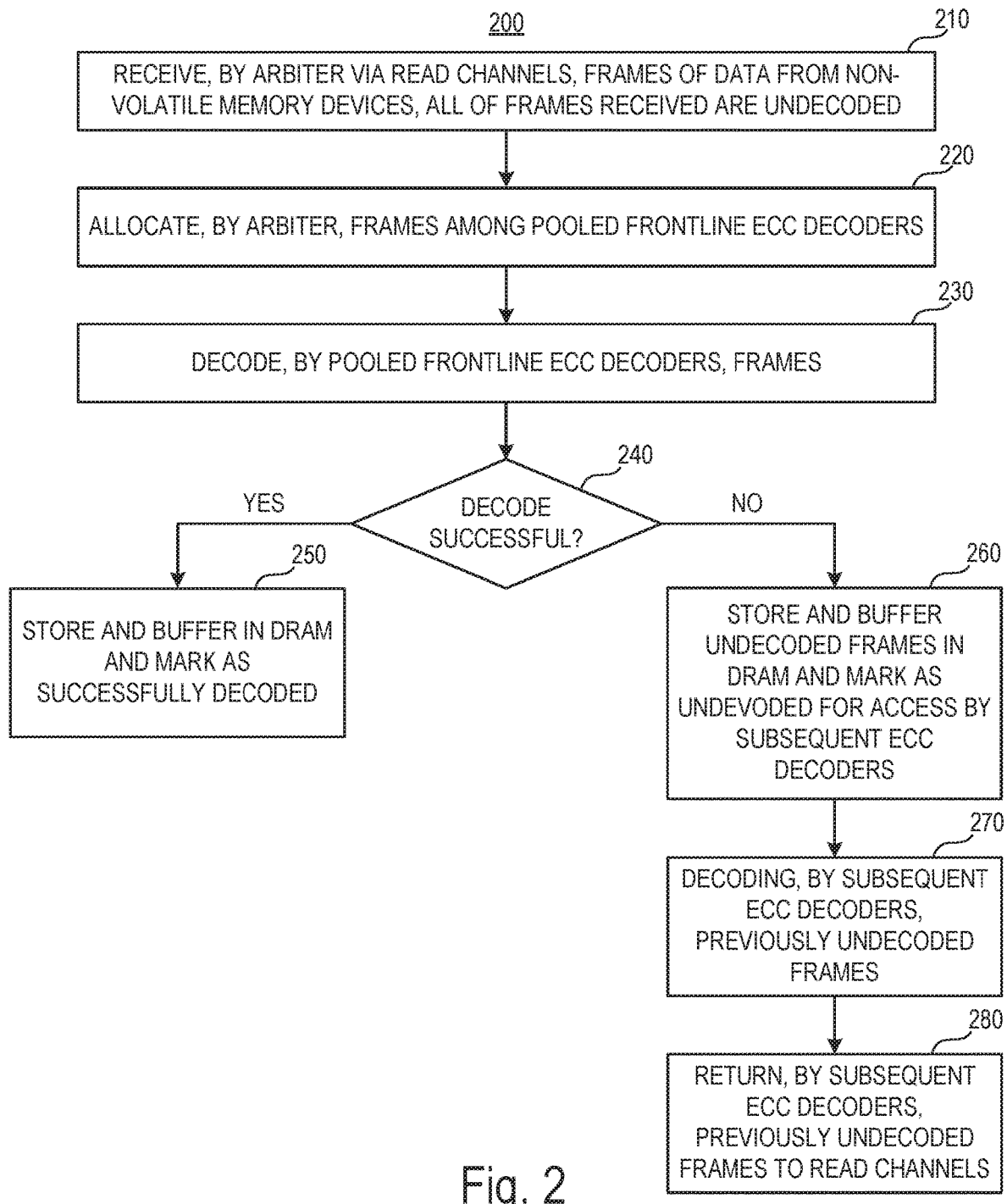
FIG. 2 shows a flow chart of a process for correcting data from non-volatile memory devices of an SSD device, according to some implementations.

FIG. 2 shows a flow chart of a process 200 for correcting data from non-volatile memory devices of an SSD device, according to some implementations. Referring to FIGS. 1-2, at 210, the arbiter 130 receives via the read channels 125-125n frames of data from the non-volatile memory devices 120a-120n. At this point, all of the frames received have not been decoded or corrected by any ECC decoders.

At 220, the arbiter 130 allocates the frames among the pooled frontline ECC decoders 140a-140n. That is, the arbiter 130 selects one of the pooled frontline ECC decoders 140a-140n for each frame of data received via the channels 125a-125n. In some arrangements, arbiter 130 allocates the frames based on availability of the pooled frontline ECC decoders 140a-140n, the type of code data of the frame to be decoded, and the type of code supported by the pooled frontline ECC decoders 140a-140n.

A pooled frontline ECC decoder is available if that pooled frontline ECC decoder is online, not otherwise busy decoding another frame or not offline due to maintenance, lack of power, failure, or the like. Each received frame includes code metadata indicating the type of code data defined for the frame. Each pooled frontline ECC decoders 140a-140n can support at least one type of code. A pooled frontline ECC decoder can attempt to decode and correct a frame if the type of code data defined for the frame and the type of code supported by the pooled frontline ECC decoder match. In that regard, for a given frame, arbiter 130 selects one of the pooled frontline ECC decoders 140a-140n that is available and supports the type of code matching the type of code data defined for that frame.

At 230, the pooled frontline ECC decoders 140a-140n decode the frames. A selected one of the pooled frontline ECC decoders 140a-140n decodes and corrects a frame of data, in accordance with the allocation by the arbiter 130.

At 240, the pooled frontline ECC decoders 140a-140n determine whether the frames are successfully decoded and corrected. With respect to the frames that are successfully decoded and corrected by the pooled frontline ECC decoders 140a-140n (240:YES), the decoded frames are stored and buffered in DRAM and marked as successfully decoded, at 250. The pooled frontline ECC decoders 140a-140n can output decoded and corrected frames, referred to as first decoded frames. The first decoded frames are buffered in DRAM as marked as such.

On the other hand, with respect to the frames that cannot be decoded or corrected by the pooled frontline ECC decoders 140a-140n (240:NO), the pooled frontline ECC decoders 140a-140n store and buffer the undecoded frames in DRAM and mark as undecoded, for access by the subsequent ECC decoders 150, at 260. As described, the subsequent ECC decoders 150 include one or more of the second-line decoders 152, the third-line decoders 154, and the fourth-line decoders 156. At 270, the subsequent ECC decoders 150 decode the previously undecoded and uncorrected frames. At 280, the subsequent ECC decoders 150 return decoded and corrected frames corresponding to the previously undecoded and uncorrected frames to the read channels 125a-125n.

With regard to 260-280, responsive to determining that the pooled frontline ECC decoders 140a-140n have failed to decode some of the frames received via the read channels 125a-125n by the arbiter 130, the pooled frontline ECC decoders 140a-140n can send the undecoded and uncorrected frames to the DRAM 160. The subsequent ECC decoders 150 can overwrite the failed frames with decoded frames. The DRAM 160 can send or otherwise input the undecoded and uncorrected frames to the second-line ECC decoders 152. The second-line ECC decoders 152 decode and correct the previously undecoded and uncorrected frames to output second decoded frames. The second-line ECC decoders 152 store and buffer the second decoded frames in DRAM, overwriting any previous undecoded and uncorrected copies. The second decoded frames are marked as decoded and corrected, for subsequent processing by functions to process the decoded and corrected frames (not shown for clarity). Alternatively, the previously undecoded and uncorrected frames can be put back into the DRAM 160 so that the firmware can attempt to decode and correct the frames, e.g., if the DRAM 160 is considered a part of the read channels 125a-125n.

If some frames are still undecoded and uncorrected by the pooled frontline ECC decoders 140a-140n and the second-line ECC decoders 152, the third-line ECC decoders 154 can be used to decode and correct those frames. For example, responsive to determining that the pooled frontline ECC decoders 140a-140n and the second-line ECC decoders 152 have failed to decode some of the frames received via the read channels 125a-125n by the arbiter 130, the second-line ECC decoders 152 DRAM 160 can store and buffer in DRAM 160 or otherwise input the undecoded and uncorrected frames to the third-line ECC decoders 154. The third-line ECC decoders 154 decode and correct the previously undecoded and uncorrected frames to output third decoded frames. The third-line ECC decoders 154 store and buffer the third decoded frames in DRAM, overwriting any previous undecoded and uncorrected copies. The third decoded frames are marked as decoded and corrected, for subsequent processing by functions to process the decoded and corrected frames (not shown for clarity).

If some frames are still undecoded and uncorrected by the pooled frontline ECC decoders 140a-140n, the second-line ECC decoders 152, and the third-line ECC decoders 154, the fourth-line ECC decoders 156 can be used to decode and correct those frames. For example, responsive to determining that the pooled frontline ECC decoders 140a-140n, the second-line ECC decoders 152, and the third-line ECC decoders 154 have failed to decode some of the frames received via the read channels 125a-125n by the arbiter 130, the third-line ECC decoders 154 or the DRAM 160 can send or otherwise input the undecoded and uncorrected frames to the fourth-line ECC decoders 156. The fourth-line ECC decoders 154 decode and correct the previously undecoded and uncorrected frames to output fourth decoded frames. The fourth-line ECC decoders 156 store and buffer the fourth decoded frames in DRAM, overwriting any previous undecoded and uncorrected copies. The fourth decoded frames are marked as decoded and corrected, for subsequent processing by functions to process the decoded and corrected frames (not shown for clarity).

As such, the pool of frontline ECC decoders 135, the second-line ECC decoders 152, the third-line ECC decoders 154, and the fourth-line ECC decoders 156 provide layers of decoding and correction of the frames originally received by the arbiter 130 via the channels 125a-125n.

In some arrangements, the codes of the pooled frontline ECC decoders 140a-140n may implement ECC algorithms using microcoded hardware which can be configured to be changed or reprogrammed at runtime. In such arrangements, one or more of the pooled frontline ECC decoders 140a-140n can be turned offline and the microcode changed or updated without stalling any of the read channel 125a-125n. This allows the pooled frontline ECC decoders 140a-140n to be changed or updated with no interruption and minimal loss of performance. As such, at least one of the pooled frontline ECC decoders 140a-140n can be changed or updated while the remaining pooled frontline ECC decoders 140a-140n are decoding the frames received via the read channels 125a-125n. The arbiter 130 has knowledge that the at least one of the pooled frontline ECC decoders 140a-140n is switched offline for update, and exclude (does not select) the at least one of the pooled frontline ECC decoders 140a-140n until the arbiter 130 is notified that the at least one of the pooled frontline ECC decoders is back online.

Figure 3:
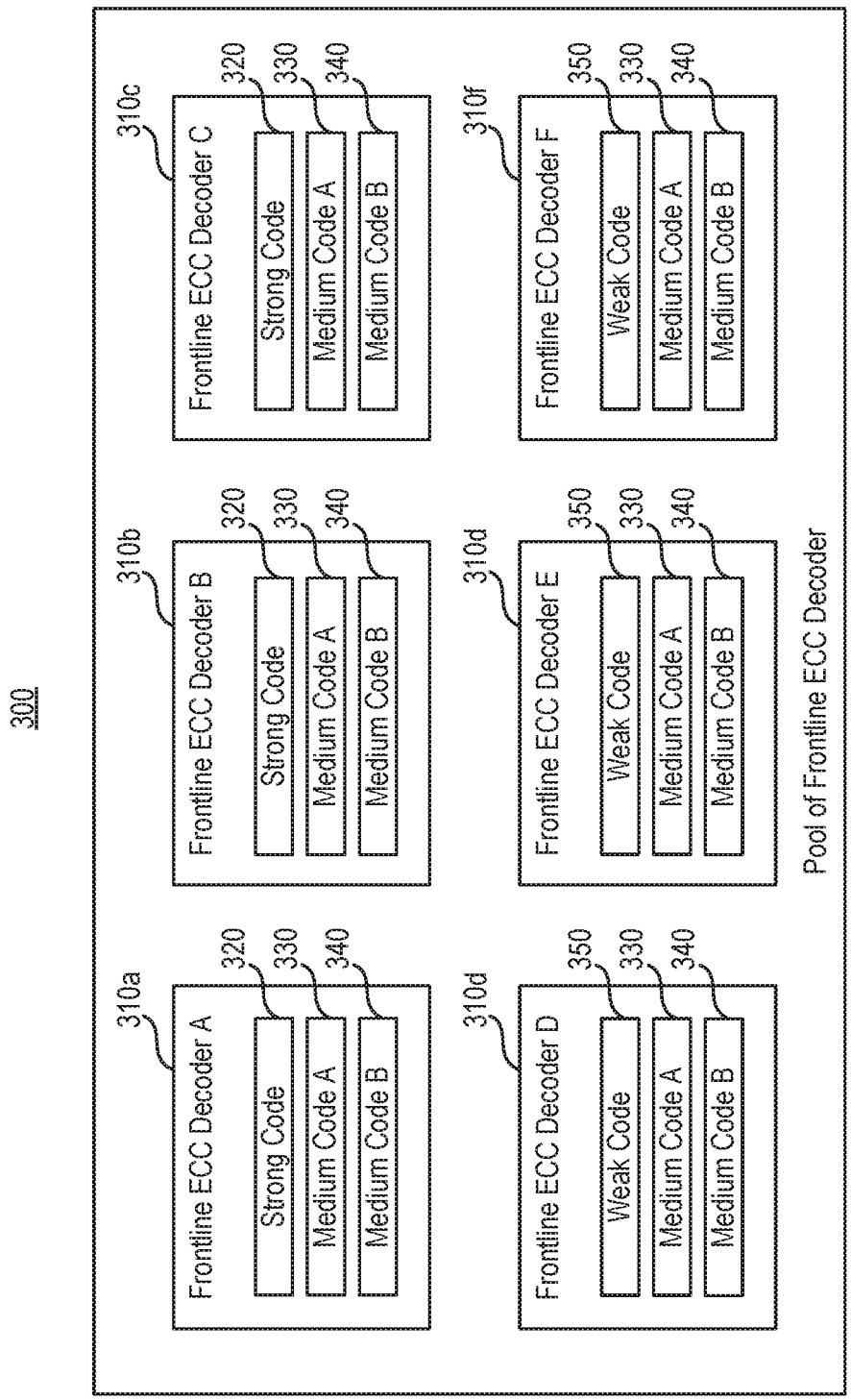
FIG. 3 shows a block diagram of a pool of frontline ECC decoders, according to some implementations.

In some arrangements, the frontline ECC decoders can be pooled such that multiple ECC codes can be supported by a given pool of frontline ECC decoders. FIG. 3 shows a block diagram of a pool of frontline ECC decoders 300, according to some arrangements. The pool of frontline ECC decoders 300 includes frontline ECC decoders 310a-310f, each of which is configured to support three ECC codes in this example. This configuration may suit circumstances in which the medium decoders are likely to be used more frequently than the strong and weak decoders, so there are more medium decoders provided for than weak and strong decoders. The pool of frontline ECC decoders 300 includes three decoders 310a-310c, each supporting a strong code 320. The pool of frontline ECC decoders 300 includes three decoders 310d-310f, each supporting a weak code 320. Each of the frontline ECC decoders 310a-310f support two medium-strength codes (e.g., medium code A 330 and medium code B 340). In that regard, the pool of frontline ECC decoders 300 can support four different ECC codes of three different strengths even though each individual frontline ECC decoder supports three ECC codes. In some types of decoder, the more ECC codes that a given ECC decoder supports, the more memory (e.g., Random Access Memory (RAM)) is needed by the ECC decoder. The additional memory requirement makes the ECC decoder larger. That is, the size of an ECC decoder typically increases with the number of ECC codes supported by the ECC decoder. Thus, by pooling the ECC decoders together in the manner described, the aggregated size of the ECC decoders can be reduced, causing the floor space of the controller 110 to be conserved.

Furthermore, the size of an ECC decoder typically increases as the code rate decreases. Therefore, the size of the ECC decoder can be reduced if the pool has a fewer number of decoders to support the minimum code rate.

In some examples, a typical Bose-Chaudhuri-Hocquenghem (BCH) decoder supports BCH 40 (decoding up to 40 errors), BCH 60 (decoding up to 60 errors), and BCH 80 (decoding up to 80 errors). Traditionally, a BCH decoder (e.g., a frontline ECC decoder) sitting in a read channel combines the BCH 40, BCH 60, and BCH 80, resulting in a large decoder. BCH 80 is rarely needed. Traditionally, one BCH decoder supporting BCH 40, BCH 60, and BCH 80 and seven BCH decoders supporting only BCH 40 and BCH 60 are used for read channels. Other combinations may be available depending on the profile of the non-volatile memory devices.

With respect to product codes, where each data bit in a frame may be encoded in multiple ways as a member of multiple frames (for example a bit in a 2 dimensional array of bits may be twice encoded as a member of a row frame of bits and a column frame of bits), two or more ECC decoders supporting different codes can be pooled such that different ECC decoders in the same pool can work with different codes at the same time, regardless of whether the frames are received from a same read channel. For example, the arbiter 130 may receive two frames of data from a read channel (e.g., the read channel 125a). A first frame has a first type of code data. The first type of code data can be decoded using a first code supported by a first frontline ECC decoder. A second frame has a second type of code data different from the first type. The second type of code data can be decoded using a second code supported by a second frontline ECC decoder. The arbiter 130 is configured to select the first frontline ECC decoder to decode the first frame, if the first frontline ECC decoder is available. The arbiter 130 is configured to select the second frontline ECC decoder to decode the second frame, if the second frontline ECC decoder is available. This allows the frames from a same read channel to be decoded by two different frontline ECC decoders based on the type of code supported by the frontline ECC decoders, while improving operational efficiency because the two frames can be decoded simultaneously by two different frontline ECC decoders.

In some examples, the arbiter 130 may receive two frames of data from a read channel (e.g., the read channel 125a). The two frames have a same type of code data. First and second frontline ECC decoders support the type of code used to decode the type of code data of the two frames. The arbiter 130 is configured to select the first frontline ECC decoder to decode the first frame, if the first frontline ECC decoder is available. The arbiter 130 is configured to select the second frontline ECC decoder to decode the second frame, if the second frontline ECC decoder is available. Such arrangements improve operational efficiency because the two frames can be decoded simultaneously by two different frontline ECC decoders.

Traditionally, all die on a particular read channel have to be the same type given that each read channel has a dedicated frontline ECC decoder arranged therein. On the other hand, with a pool of frontline ECC decoders, the frontline ECC decoder is not dedicated to one particular read channel, such that different die types (e.g., Triple-level cells (TLC) and quad-level cells (QLC)) can share the channel. In addition, it is possible for QLC memory cells addressed by particular word lines (WLs) to exhibit higher than normal error rates (known as "bad WLs"), which may exceed the error correcting capabilities of the frontline ECC decoders. In this case, these cells may be operated in a pseudo-TLC (pTLC) mode to reduce the error rates, such that the bad WLs would typically need a different level of protection. Therefore, the frontline ECC decoders would need to support both QLC and pTLC modes of operation with different ECC decoders for each mode, which can be more easily supported by a pool of frontline ECC decoders.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary examples, the functions described may be implemented in hardware, software, firmware, or any combination thereof. If implemented in software, the functions may be stored as one or more instructions or code on a non-volatile computer-readable storage medium or non-volatile processor-readable storage medium. Examples of non-volatile memory include but are not limited to, NAND flash memory, NOR flash memory, magnetic MRAM, RRAM, PCM and battery-backed volatile memories. The steps of a method or algorithm disclosed herein may be embodied in a processor-executable software module which may reside on a non-volatile computer-readable or processor-readable storage medium. Non-volatile computer-readable or processor-readable storage media may be any storage media that may be accessed by a computer or a processor. By way of example but not limitation, such non-volatile computer-readable or processor-readable storage media may include RAM, ROM, EEPROM, FLASH memory, CD-ROM or other optical disk storage, magnetic disk storage or other magnetic storages, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-volatile computer-readable and processor-readable media. Additionally, the operations of a method or algorithm may reside as one or any combination or set of codes and/or instructions on a non-volatile processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A method for correcting data read from a plurality of non-volatile memory devices of a memory system and stored in a memory buffer, the method comprising:
   receiving, by an arbiter via a plurality of read channels, frames of the data from the plurality of non-volatile memory devices, wherein all of the frames received are coded;
   allocating, by the arbiter, the frames among a plurality of pooled frontline Error Correction Code (ECC) decoders;
   decoding, by the plurality of pooled frontline ECC decoders, the frames to output first decoded frames; and
   storing, by the plurality of pooled frontline ECC decoders, the first decoded frames into the memory buffer.

2. The method of claim 1, further comprising:
   determining that the plurality of pooled frontline ECC decoders failed to decode some of the frames;
   storing the some of the frames into the memory buffer for access by a plurality of second-line ECC decoders;
   decoding, by the plurality of second-line ECC decoders, the some of the frames to output second decoded frames; and
   storing, by the plurality of second-line ECC decoders, the second decoded frames into the memory buffer.

3. The method of claim 1, further comprising:
   determining that the plurality of pooled frontline ECC decoders and a plurality of second-line ECC decoders failed to decode some of the frames;
   storing the some of the frames into a plurality of third-line ECC decoders;
   decoding, by the plurality of third-line ECC decoders, the some of the frames to output third decoded frames; and
   storing, by the plurality of third-line ECC decoders, the third decoded frames into the memory buffer.

4. The method of claim 1, wherein the plurality of pooled frontline ECC decoders is outside of the plurality of read channels.

5. The method of claim 1, further comprising updating at least one of the plurality of pooled frontline ECC decoders while others of the plurality of pooled frontline ECC decoders are decoding the frames.

6. The method of claim 1, wherein the frames are allocated among the plurality of pooled frontline ECC decoders based on availability of the pooled frontline ECC decoders, types of code data of the frames, and types of codes supported by the pooled frontline ECC decoders.

7. The method of claim 6, wherein
   a first frame of the plurality of frames has a type of code data corresponding to a type of codes supported by a first pooled frontline ECC decoder;
   the first pooled frontline ECC decoder is available; and the first frame is allocated to be decoded by the first pooled frontline ECC decoder.

8. The method of claim 1, wherein
the frames comprise a first frame and a second frame received from a same one of the plurality of read channels; and
allocating the frames among the plurality of pooled frontline ECC decoders comprises allocating the first frame to a first one of the plurality of pooled frontline ECC decoders and allocating the second frame to a second one of the plurality of pooled frontline ECC decoders.

9. The method of claim 8, wherein the first one of the plurality of pooled frontline ECC decoders and the second one of the plurality of pooled frontline ECC decoders support different codes.

10. The method of claim 8, wherein the first one of the plurality of pooled frontline ECC decoders and the second one of the plurality of pooled frontline ECC decoders support same codes.

11. A memory controller of a memory system, comprising:
a plurality of pooled frontline Error Correction Code (ECC) decoders configured to decode data read from a plurality of non-volatile memory devices;
a plurality of subsequent ECC decoders configured to decode data failed to be decoded by the plurality of pooled frontline ECC decoders; and
an arbiter operatively coupled to a plurality of read channels, wherein the arbiter is configured to:
receive, via the plurality of read channels, frames of the data from the plurality of non-volatile memory devices, and
allocate the frames among the plurality of pooled frontline ECC decoders.

12. The memory controller of claim 11, wherein the plurality of pooled frontline ECC decoders is outside of a plurality of read channels.

13. The memory controller of claim 11, wherein the arbiter allocates the frames among the plurality of pooled frontline ECC decoders based on availability of the pooled frontline ECC decoders, types of code data of the frames, and types of codes supported by the pooled frontline ECC decoders.

14. The memory controller of claim 11, wherein
at least one of the plurality of pooled frontline ECC decoders is updated while others of the plurality of pooled frontline ECC decoders are decoding the frames.

15. A memory system, comprising:
a first plurality of non-volatile memory devices;
a memory controller, comprising:
a first plurality of pooled frontline Error Correction Code (ECC) decoders configured to decode data stored by the first plurality of non-volatile memory devices;
a plurality of subsequent ECC decoders configured to decode data failed to be decoded by the first plurality of pooled frontline ECC decoders;
a first arbiter operatively coupled to the first plurality of read channels, wherein the first arbiter is configured to:
receive, via the first plurality of read channels, first frames of the data from the first plurality of non-volatile memory devices, and
allocate the first frames among the first plurality of pooled frontline ECC decoders; and
a first plurality of read channels operatively coupled to the first plurality of non-volatile memory devices and the memory controller.

16. The memory system of claim 15, further comprising:
a second plurality of non-volatile memory devices;
a second plurality of read channels operatively coupled to the second plurality of non-volatile memory devices and the memory controller, wherein
the memory controller further comprises a second plurality of pooled frontline ECC decoders configured to decode data stored by the second plurality of non-volatile memory devices.

17. The memory system of claim 16, wherein the memory controller further comprises a second arbiter operatively coupled to the second plurality of read channels, wherein the second arbiter is configured to:
receive, via the second plurality of read channels, second frames of the data from the second plurality of non-volatile memory devices; and
allocate the second frames among the second plurality of pooled frontline ECC decoders.

* * * * *